United States Patent
Jambunathan et al.

(10) Patent No.: US 10,559,689 B2
(45) Date of Patent: Feb. 11, 2020

(54) CRYSTALLIZED SILICON CARBON REPLACEMENT MATERIAL FOR NMOS SOURCE/DRAIN REGIONS

(71) Applicant: INTEL CORPORATION, Santa Clara, CA (US)

(72) Inventors: Karthik Jambunathan, Hillsboro, OR (US); Glenn A. Glass, Portland, OR (US); Anand S. Murthy, Portland, OR (US); Jacob M. Jensen, Beaverton, OR (US); Daniel B. Aubertine, North Plains, OR (US); Chandra S. Mohapatra, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/777,707

(22) PCT Filed: Dec. 24, 2015

(86) PCT No.: PCT/US2015/000404
§ 371 (c)(1),
(2) Date: May 21, 2018

(87) PCT Pub. No.: WO2017/111845
PCT Pub. Date: Jun. 29, 2017

(65) Prior Publication Data
US 2018/0374951 A1    Dec. 27, 2018

(51) Int. Cl.
*H01L 21/8234* (2006.01)
*H01L 29/78* (2006.01)
(Continued)

(52) U.S. Cl.
CPC .... *H01L 29/7848* (2013.01); *H01L 21/02524* (2013.01); *H01L 21/02667* (2013.01);
(Continued)

(58) Field of Classification Search
CPC ...... H01L 21/70; H01L 21/71; H01L 21/8232
See application file for complete search history.

(56) References Cited

U.S. PATENT DOCUMENTS

2008/0265321 A1    10/2008 Yu et al.
2009/0032840 A1    2/2009 Gluschenkov et al.
(Continued)

FOREIGN PATENT DOCUMENTS

JP    2003-243532    8/2003
WO    2017/111845    6/2017

OTHER PUBLICATIONS

International Search Report and Written Opinion received for Patent Application No. PCT/US2015/000404, dated Sep. 23, 2016, 13 pages.

(Continued)

*Primary Examiner* — Cheung Lee
(74) *Attorney, Agent, or Firm* — Finch & Maloney PLLC (57) ABSTRACT

Tensile strain is applied to a channel region of a transistor by depositing an amorphous $Si_xGe_{1-x-y}C_y$ alloy in at least one of a source and a drain (S/D) region of the transistors. The amorphous $Si_xGe_{1-x-y}C_y$ alloy is crystallized, thus reducing the unit volume of the alloy. This volume reduction in at least one of the source and the drain region applies strain to a connected channel region. This strain improves electron mobility in the channel. Dopant activation in the source and drain locations is recovered during conversion from amorphous to crystalline structure. Presence of high carbon concentrations reduces dopant diffusion from the source and drain locations into the channel region. The techniques may be employed with respect to both planar and non-planar (e.g., FinFET and nanowire) transistors.

18 Claims, 9 Drawing Sheets

(51) Int. Cl.
    *H01L 29/417*     (2006.01)
    *H01L 21/02*     (2006.01)
    *H01L 29/165*     (2006.01)
    *H01L 29/66*     (2006.01)
    *H01L 29/786*     (2006.01)

(52) U.S. Cl.
    CPC .... *H01L 21/823418* (2013.01); *H01L 29/165* (2013.01); *H01L 29/41725* (2013.01); *H01L 29/66742* (2013.01); *H01L 29/66795* (2013.01); *H01L 29/785* (2013.01); *H01L 29/78696* (2013.01)

(56) References Cited

U.S. PATENT DOCUMENTS

| | | | |
|---|---|---|---|
| 2013/0032865 A1* | 2/2013 | Chan | H01L 21/2254 257/288 |
| 2013/0140576 A1 | 6/2013 | Mieno et al. | |
| 2015/0144880 A1 | 5/2015 | Rachmady et al. | |

OTHER PUBLICATIONS

International Preliminary Report on Patentability received for Patent Application No. PCT/US2015/000404, dated Jun. 26, 2018, 9 pages.

\* cited by examiner

CRYSTALLIZED SILICON CARBON REPLACEMENT MATERIAL FOR NMOS SOURCE/DRAIN REGIONS

BACKGROUND

A building block of integrated circuits is the transistor. A transistor can be implemented in both planar and non-planar topologies. A planar transistor generally includes a channel region within a semiconductor substrate. A gate stack including a gate electrode over a gate dielectric is provisioned directly over the channel. Gate spacers are provisioned to either side of the gate stack. Source and drain regions are provisioned to each side of the channel, and may extend under the corresponding gate spacer, or even the gate dielectric, in some cases. Non-planar transistor topologies are typically based on a fin structure, and generally include so-called FinFETs and nanowire transistors.

A FinFET is a transistor built around a thin strip of semiconductor material (generally referred to as the fin) that extends from an underlying substrate. The transistor includes the standard field-effect transistor (FET) nodes, including a gate, a gate dielectric, a source region, and a drain region. The conductive channel of the transistor effectively resides on sides of the fin beneath the gate dielectric. Specifically, current runs along/within both sidewalls of the fin (i.e., on sides perpendicular to the underlying substrate surface) as well as along the top of the fin (i.e., on a side parallel to the underlying substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor, sometimes referred to as a gate-all-around transistor, is effectively a fin that has a relatively low aspect ratio because some underlying portion of the fin is removed so that the gate stack material can surround the channel region on all sides.

DETAILED DESCRIPTION

Techniques are disclosed for improving performance of n-type metal oxide semiconductor (NMOS) transistors. Specifically, techniques are disclosed for providing tensile strain and/or increasing retention of tensile strain in a channel region of a transistor disposed between source/drain (S/D) regions of the transistor. This strain improves dopant activation in the source and drain regions of an NMOS transistor, improves dopant activation in the channel region, and reduces dopant diffusion from the source and drain regions of the NMOS transistor into the channel region. The techniques may be employed with respect to both planar and non-planar (e.g., FinFET and nanowire) transistors. In accordance with an embodiment, a gate stack is formed over a channel region of a given substrate. Source and drain cavities are then formed (e.g., by etching) on either side of the gate stack. An amorphous $Si_xGe_{1-x-y}C_y$ alloy is selectively deposited into each cavity. The alloy may be in-situ doped with phosphorous or other n-type dopant. The carbon content of the $Si_xGe_{1-x-y}C_y$ is, in some embodiments, higher than that typically associated with crystalline phases of $Si_xGe_{1-x-y}C_y$ alloys (e.g., greater than 5 atomic % or greater than 10 atomic %). Once deposited, the amorphous $Si_xGe_{1-x-y}C_y$ alloy is crystallized into a stoichiometric crystal of $Si_xGe_{1-x-y}C_y$. Some of the carbon originally deposited in excess of a stoichiometric amount of a crystalline $Si_xGe_{1-x-y}C_y$ phase is, in some examples, rejected into a separate phase of carbon-rich precipitates upon crystallization of the as-deposited amorphous $Si_xGe_{1-x-y}C_y$ alloy. Because carbon has a smaller atomic radius than either of silicon or germanium, the lattice constants of the alloy crystal are less than those of the original source/drain material and less than those of the amorphous $Si_xGe_{1-x-y}C_y$ alloy originally deposited in an amorphous phase. Because the alloy and the channel region are in intimate contact or are otherwise sufficiently close to one another, a change in volume upon crystallization applies a tensile strain to the channel region between the source and drain locations as the volume of the material within the cavity changes. The application of tensile strain to the channel improves electron mobility, and carbon in the S/D regions reduces dopant diffusion within the S/D regions, which in turn reduces diffusion of dopant into the channel, among other benefits. Conversion of the S/D material from amorphous to crystalline structure facilitates dopant activation and causes a recovery of tip resistance and contact resistance that generally exhibit poor performance in amorphous silicon based alloys. Numerous variations and configurations will be apparent in light of this disclosure.

Upon analysis (e.g., using scanning/transmission electron microscopy (SEM/TEM), composition mapping, secondary ion mass spectrometry (SIMS), atom probe tomography), a structure or device configured in accordance with one or more embodiments will show source/drain regions fabricated from $Si_xGe_{1-x-y}C_y$ alloys. The $Si_xGe_{1-x-y}C_y$ alloys analyzed will show carbon concentrations in the source/drain regions of at least 5 atomic %. Furthermore, the analyzed $Si_xGe_{1-x-y}C_y$ alloys may show carbon-rich precipitates within the fins. The analyzed transistor structures may also show low dopant diffusion from the source and drain regions into the channel region as evidenced by dopant diffusion extending, for instance, 4 nanometers (nm) or less into the channel region, according to some example embodiments.

Example Architecture and Methodology

Figure 1A:
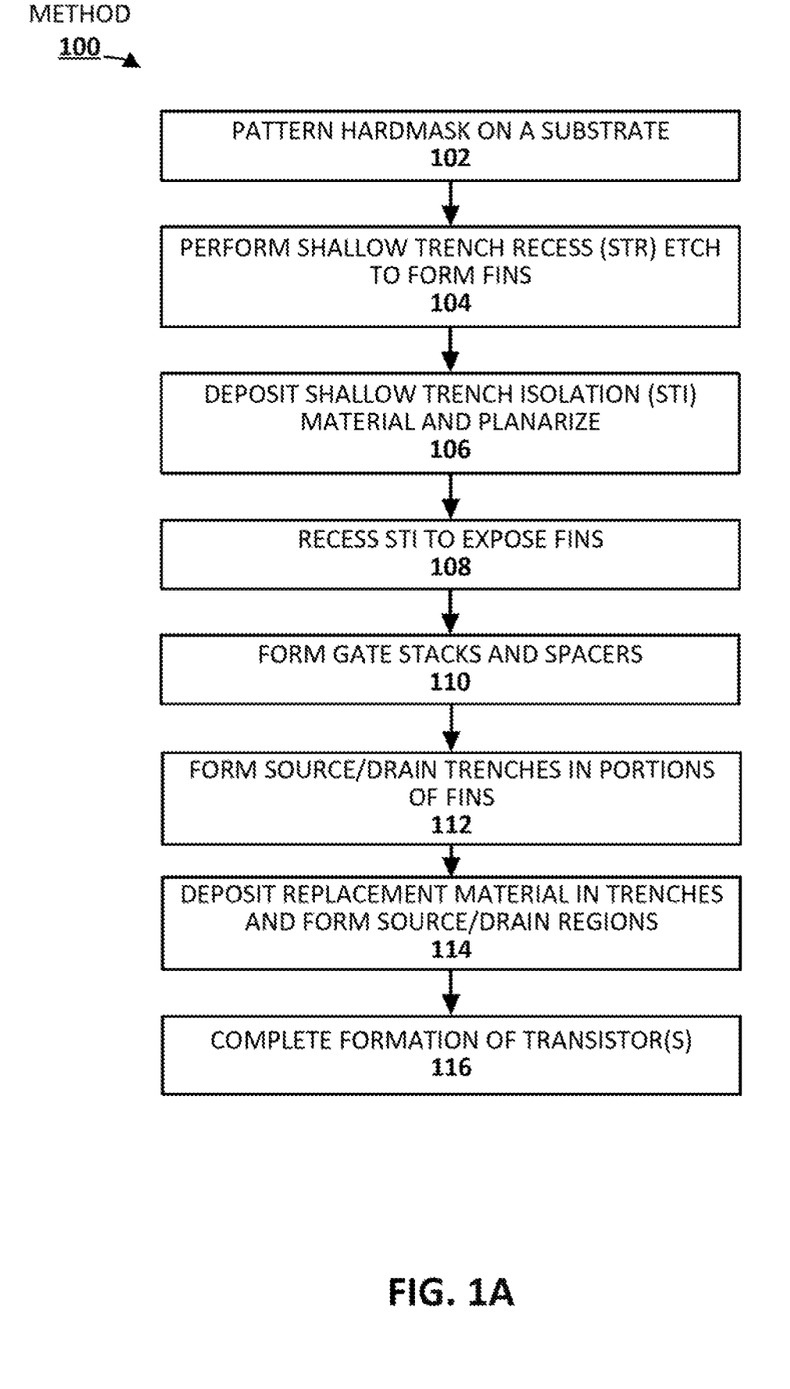
FIG. 1A illustrates a method of forming a non-planar integrated circuit in which a tensile strain is applied to a channel region of the non-planar integrated circuit, in accordance with various embodiments of the present disclosure.
Figure 1B:
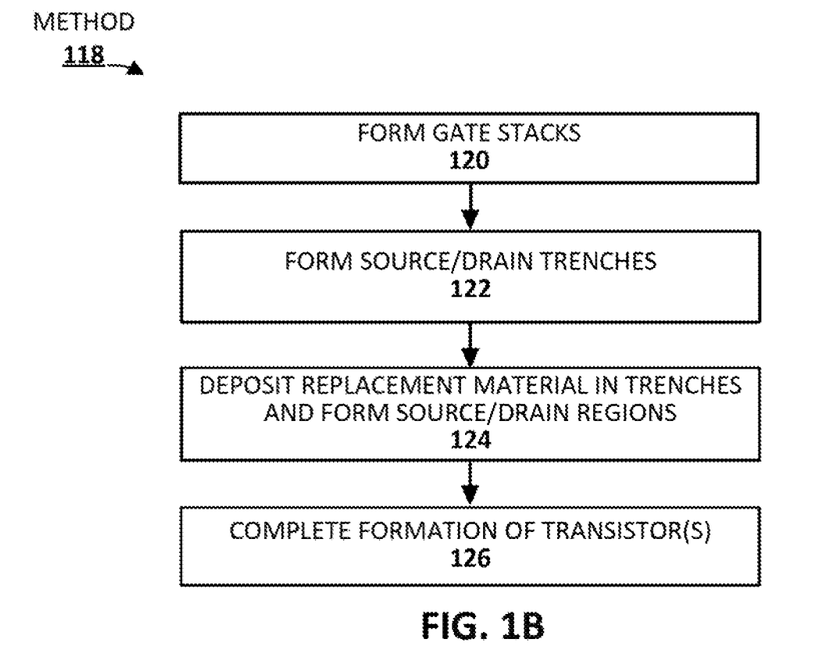
FIG. 1B illustrates a method of forming a planar integrated circuit in which a tensile strain is applied to a channel region of the planar integrated circuit, in accordance with various embodiments of the present disclosure.

FIG. 1A illustrates a method 100 of forming a non-planar configuration of an integrated circuit in which a tensile strain is applied to a channel region of the non-planar integrated circuit, in accordance with one or more embodiments of the present disclosure. FIGS. 2A-F illustrate example integrated circuit structures that are formed when carrying out method 100 of FIG. 1A, in accordance with various embodiments. FIG. 1B illustrates a method 118 of forming a planar integrated circuit in which a tensile strain is applied to a channel region of the planar integrated circuit, in accordance with various embodiments of the present disclosure. FIGS. 2H and 2H' illustrate example structures that are formed when carrying out the method of FIG. 1B.

Figure 1C:
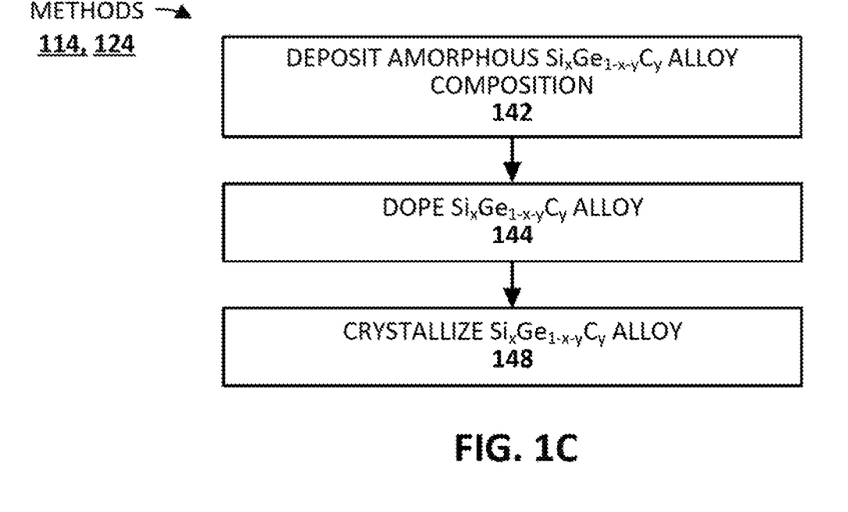
FIG. 1C illustrates a detailed method of forming structures to apply a tensile strain to a channel region adjacent source and drain regions in either of non-planar or planar integrated circuits, in accordance with various embodiments of the present disclosure.

FIG. 1C illustrates in more detail a sub-method 114 of the method 100 and a sub-method 124 of the method 118. In the sub-methods 114, 124 structures are formed that increase tensile strain in a channel region of a transistor fabricated according to either one of the methods 100 or 118. This tensile strain improves dopant activation in the source and drain regions of the transistor and reduces diffusion of the dopant atoms from the source and drain regions into a corresponding channel region, and improves electron mobility in the channel region, among other benefits. Structures formed according to the sub-methods 114 and 124 are illustrated in FIGS. 2I, 2J, and 2H and 2H' respectively.

The structures of FIGS. 2A-G, 2I, and 2J are primarily depicted and described herein in the context of forming finned transistor configurations (e.g., FinFET or tri-gate), for ease of illustration. Note that the term "fin" refers to a general shape and morphology of a semiconducting element used as a component in a non-planar transistor. The term "fin" refers to the elongate structure illustrated in the figures regardless of fin composition, or whether the fin is a "native" fin (i.e., having a same composition as the substrate), a "sacrificial" fin (i.e., used as a placeholder structure that is replaced in a subsequent process), or a "replacement" fin (i.e., taking a place of a previously removed sacrificial fin). However, the techniques can be used to form transistors of any suitable geometry or configuration, depending on the end use or target application. For example, FIGS. 3A and 3B illustrate an example integrated circuit structure including nanowire configurations, as will be discussed in more detail below. Various example transistor geometries that can benefit from the techniques described herein include, but are not limited to, field-effect transistors (FETs), metal-oxide-semi-conductor FETs (MOSFETs), tunnel-FETs (TFETs), planar configurations (as will be explained in more detail below), finned configurations (e.g., fin-FET, tri-gate), and nanowire (or nanoribbon or gate-all-around) configurations. In addition, the techniques may be used to form complementary metal oxide semiconductor (CMOS) devices/circuits, where both n-type MOS (NMOS) as provided herein are fabricated in conjunction with p-type MOS (PMOS) transistors on a common substrate, for example. However, the PMOS transistors in a CMOS device will use different materials and/or different structure than the NMOS transistors of the present disclosure.

As mentioned above, FIG. 1A illustrates the method 100 for fabricating a non-planar embodiment of a transistor of the present disclosure. The method 100 includes patterning 102 hardmask 210 on a substrate 200 to form the example resulting structure shown in FIG. 2A, in accordance with an embodiment. In some embodiments, substrate 200 may be: a bulk substrate including, e.g., Si, silicon germanium (SiGe), germanium (Ge), an X on insulator (XOI) structure where X is Si, SiGe, or Ge and the insulator material is an oxide material or dielectric material or some other electrically insulating material; or some other suitable multilayer structure where the top layer includes Si, SiGe, or Ge. Hardmask 210 on substrate 200 can be deposited using any suitable technique. For example, hardmask 210 may be blanket deposited or grown on substrate 200 using chemical vapor deposition (CVD), atomic layer deposition (ALD), physical vapor deposition (PVD), spin-on processing, and/or any other suitable process to form hardmask 210 on substrate 200. In some instances, the surface of substrate 200 to be deposited on may be treated (e.g., chemical treatment, thermal treatment, etc.) prior to deposition of hardmask 210. Hardmask 210 can be patterned 102 using any suitable techniques, such as one or more lithography and etch processes, for example. Hardmask 210 may be comprised of any suitable material(s), such as various oxide or nitride materials or both (for multilayer construction), for example. Specific oxide and nitride materials may include silicon oxide, silicon nitride, titanium oxide, hafnium oxide, aluminum oxide, or titanium nitride, just to name a few. In some cases, the hardmask 210 material may be selected based on the substrate 200 material used.

Figure 2A:
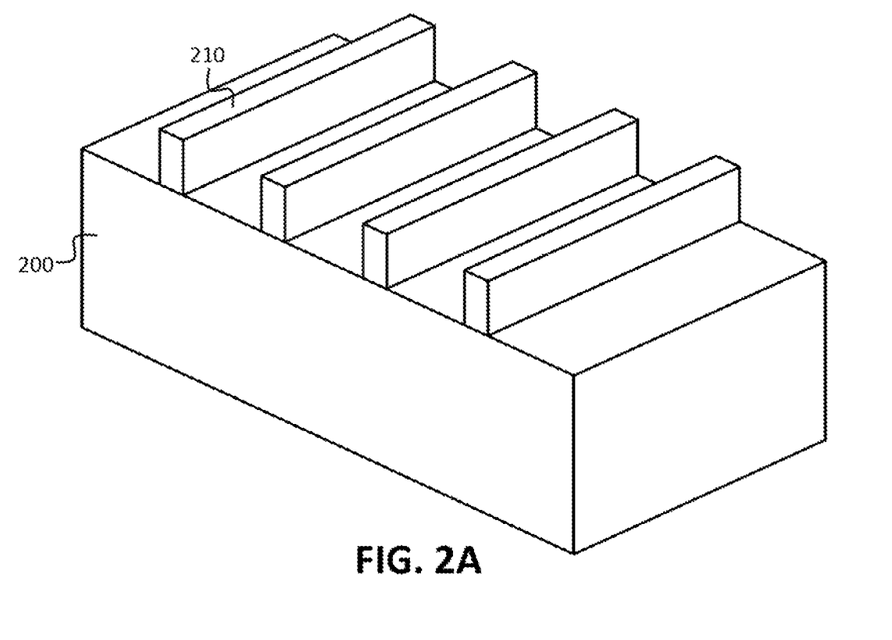
FIGS. 2A-2G illustrate example structures that are formed when carrying out the method of FIG. 1A, in accordance with various embodiments of the present disclosure.
Figure 2B:
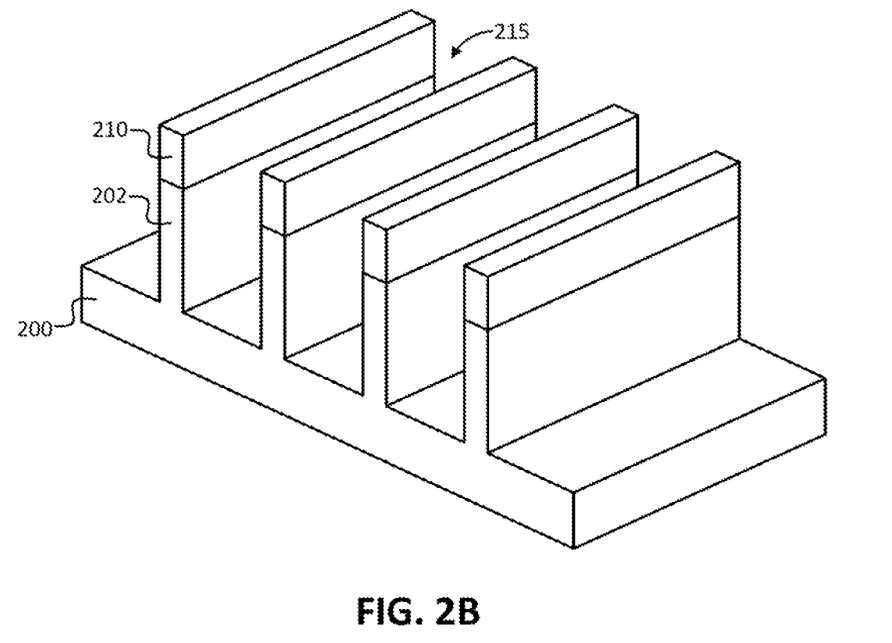
Figure 3A:
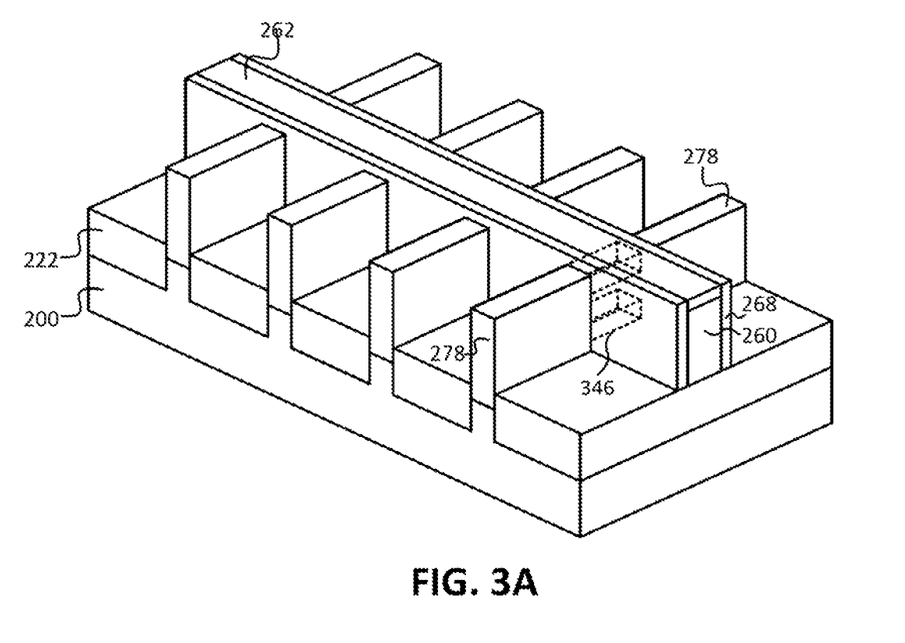
FIGS. 3A and 3B illustrates nanowire embodiments to which the method of FIG. 1C may be applied, in accordance with various embodiments of the present disclosure.
Figure 3B:
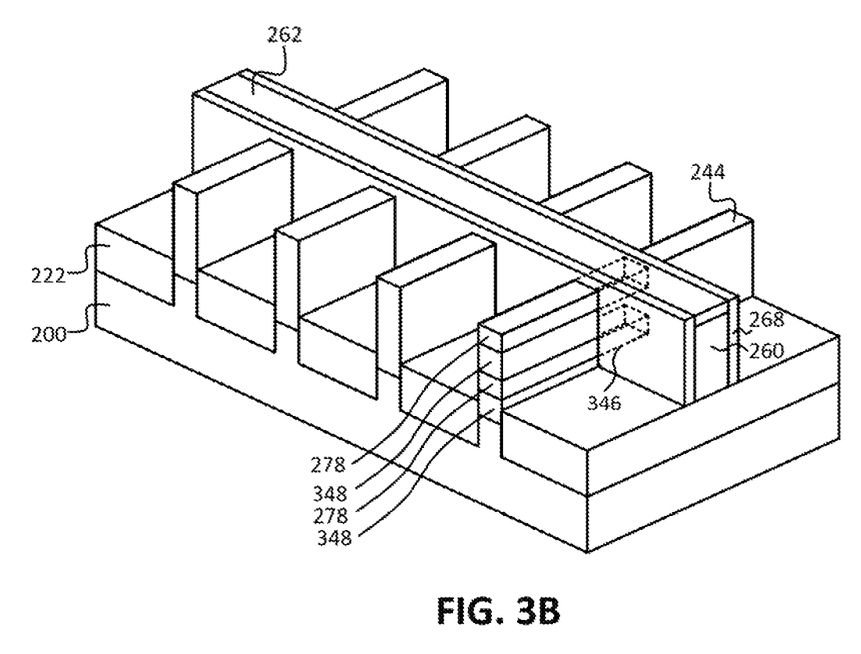

Method 100 of FIG. 1A continues with performing 104 shallow trench recess (STR) etch to form fins 202 from substrate 200, thereby forming the resulting example structure shown in FIG. 2B, in accordance with an embodiment. The STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ. Trenches 215 may be formed with varying widths and depths based on the desired fin geometry (aspect ratio, thickness, etc.). For example, multiple hardmask patterning 102 and etching 104 processes may be performed to achieve varying depths in the STR trenches 215. Fins 202 may be formed to have varying widths and heights. In some examples, a height to width (aspect) ratio of the fins may be greater than 3, such as 3 to 10, for example. Note that the trenches 215 and fins 202 are shown as having the same width and depth/height in this example structure for ease of illustration; however, the present disclosure is not intended to be so limited. Further note that although four fins 202 are shown in the example structure, any number of fins may be formed, such as one, two, ten, hundreds, thousands, millions, etc., depending on the end use or target application.

Figure 2C:
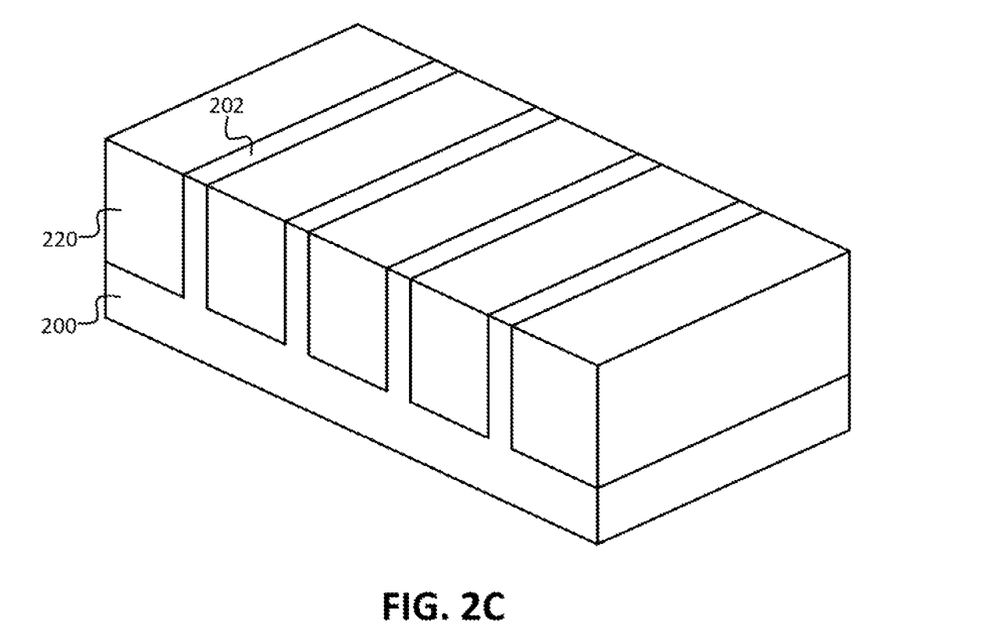

Method 100 of FIG. 1A continues with depositing 106 shallow trench isolation (STI) material 220 and planarizing to form the resulting example structure shown in FIG. 2C, in accordance with an embodiment. In some embodiments, deposition 106 of STI material 220 may include any deposition process described herein (e.g., CVD, ALD, PVD, etc.), or any other suitable deposition process. STI material 220 may include any suitable insulating material, such as one or more dielectric materials. In some embodiments, the STI material 220 may be selected based on the substrate material 200. For example, in the case of a silicon (Si) substrate 200, STI material 220 may be, for example, silicon dioxide or silicon nitride. Any suitable STI materials can be used.

Note that while the fins 202 depicted in FIG. 2C between STI material 220 are original or native to the substrate (i.e., are formed from the substrate itself) this need not be the case in other embodiments. In other embodiments, the original fins 202 are removed by etching and replaced with one or more other materials to form "replacement fins." Replacement fins may include one or more replacement materials, including any suitable semiconductor material different from the substrate material 200. For example, replacement material may be Si, SiGe, or Ge In some embodiments, the replacement material may include a single layer or a multilayer stack of semiconductor materials. A multilayer stack can be used when forming nanowire devices (for nanowires in the channel region, or in the source-drain regions, or in both channel and source/drain regions), such as a stack of Si/SiGe/Si/SiGe to form two SiGe nanowires (or Si nanowires, as the case may be). The materials discussed herein may be strained and/or doped in any suitable manner depending on the end use or target application. In still other embodiments, replacement fin materials may include layers of materials used to fabricate nanowire configurations, as will be described below in more detail.

Figure 2D:
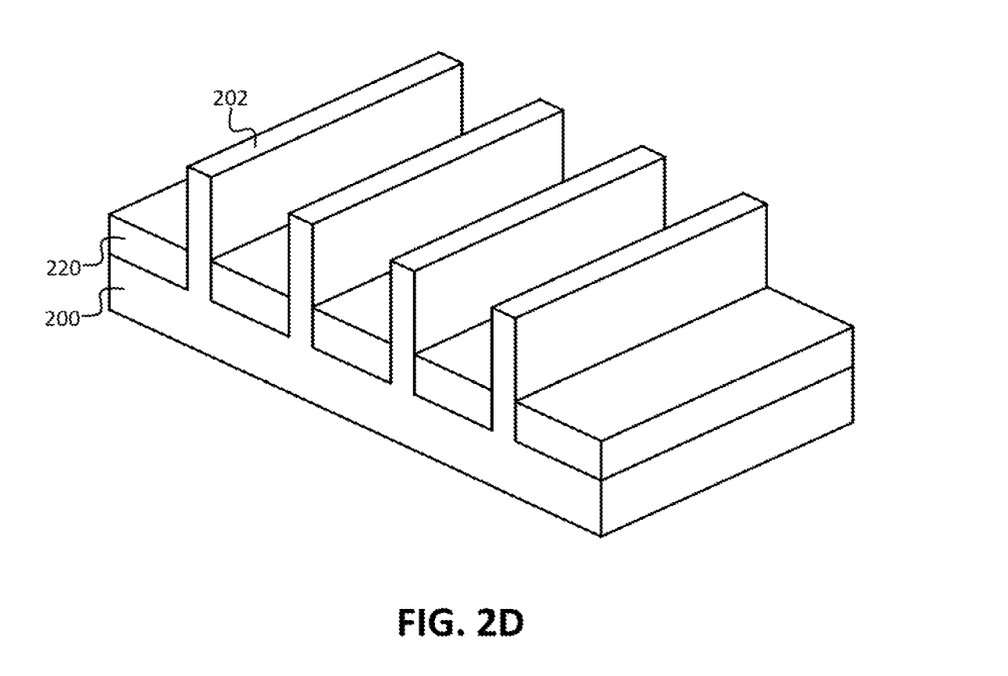

Method 100 of FIG. 1A continues with recessing 108 STI material 220 to expose some or all of the fins 202, thereby forming the resulting example structure shown in FIG. 2D, in accordance with an embodiment. Recessing 108 may include any suitable technique, such as various masking processes and wet and/or dry etching processes, for example. In some cases, recessing 108 may be performed in-situ/without air break, while in other cases the recessing 108 may be performed ex-situ.

Figure 2E:
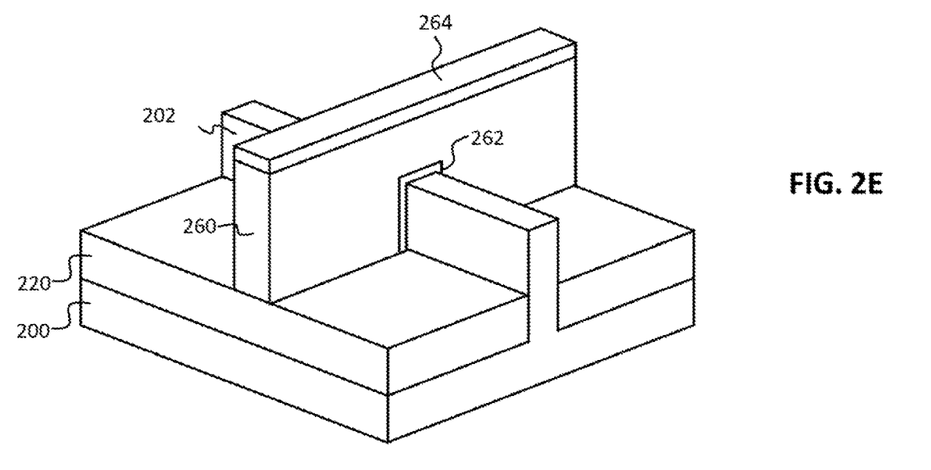

Once the fins 202 have been exposed by recessing 108 the STI material, a gate stack and spacers are formed 110, as shown in FIG. 2E. Note that while only one fin 202 is shown in FIG. 2E, this is merely for convenience of illustration. The gate stack comprises a gate electrode 260, a gate dielectric 262, and in this embodiment, a gate mask 264. The gate mask 264 is optionally disposed on the gate electrode 260 and is used to protect the gate electrode 260 from being affected by subsequent processing (e.g., etching or dopant implantation not directed at the gate electrode 260 or the gate dielectric 262). The gate dielectric 262 and gate electrode 260 may be formed using any suitable technique and from any suitable materials. The chosen gate materials may depend on whether the actual gate is being formed at this point in the process or at a later point in the process in a so-called remove metal gate (RMG) process. For the latter RMG process, the gate materials applied at this early stage of the process can be dummy gate materials, such as silicon dioxide for the gate dielectric 262 and polysilicon for the gate electrode 260. The dummy materials are subsequently removed and replaced with the actual desired gate materials, during a subsequent RMG process, which could be performed after source/drain formation, such as part of processing at 116, for instance. The gate dielectric 262 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric 262 should be sufficient to electrically isolate the gate electrode from the source and drain contacts. Further, the gate electrode 260 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. As will be appreciated, dummy gate materials can be selected simply for their place-holding ability in the intermediate structure and/or to facilitate desired processing goals, and tend to be lower value materials, given their sacrificial nature, while the actual or final gate materials can be selected based on performance goals of the transistor device.

The channel region is in the portion of the fin 202 underneath the gate stack, and the source/drain (S/D) regions are located at least one of in and on the portions of the fin 202. That is, in some embodiments the S/D regions can be disposed in a trench so that an exposed ("top") surface of the S/D regions is approximately coplanar with an exposed (top) surface of a substrate (e.g., in a planar transistor configuration). In some embodiments, the S/D regions are disposed on a top surface of a substrate in a non-planar configuration. In still other embodiments, the S/D regions can be disposed partially within a trench in the substrate and partially above the exposed (top) surface of the substrate. Regardless, S/D regions are disposed on either side of the channel region (in other words, the S/D regions are adjacent to the channel region). For example, referring again to the example embodiment of FIG. 2E, the portion of fin 202 underneath the gate stack can be used for transistor channel region, which may reside on both vertical sides of the fin and the top horizontal side of the fin 202 (for a so-called tri-gate configuration) or only on both vertical sides of the fin 202 (for a so-called double-gate configuration). In still other embodiments, the fin 202 in the channel region can be formed into one or more nanowires (such as shown in FIG. 3A), where the gate dielectric effectively wraps all the way around the wires (for a so-called gate-all-around configuration). In addition, the portion of the fins 202 immediately on either side of gate stack can be used for transistor S/D regions, which may also have a nanowire configuration (such as shown in FIG. 3B). As will be described below in more detail, some embodiments of the present disclosure include replacing portions of the fin 202 not under the gate electrode (the source/drain portions) with an amorphous $Si_xGe_{1-x-y}C_y$ alloy and recrystallizing it to impose a tensile strain on the channel region of the fin 202 underneath the gate stack.

Note that either side of fins 202 not under the gate stack can be used for either of the source region or the drain region. Accordingly, once the gate stack is fabricated, processing of S/D regions according to embodiments of the present disclosure (e.g., replacing the S/D regions with an amorphous $Si_xGe_{1-x-y}C_y$ alloy and crystallizing the alloy in situ) increases strain in the channel region adjacent the S/D regions, as described below in more detail.

Figure 2F:
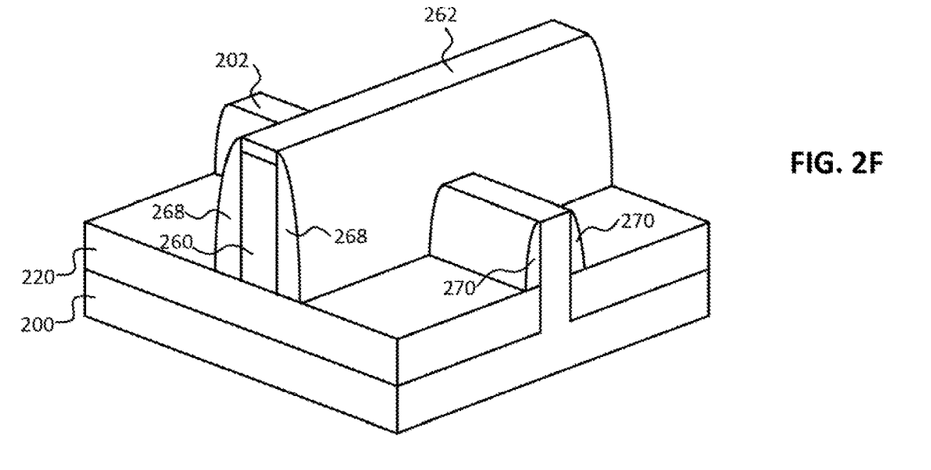

FIG. 2F depicts gate spacers 268 on either side of the gate stack and fin spacers 270 on either side of the fin 202 that are further formed at 110 according to the example method 100. The spacers are generally an electrically insulating material, such as those used for STI and described above, or a passivation layer grown on the corresponding surface (i.e., fin 202 or gate stack). In some examples, in which the fin 202 is silicon, the spacers 268 and 270 include silicon dioxide or silicon nitride, to name some specific example spacer materials. Other deposited insulating materials (e.g., deposited using photolithographic masks and any of the above mentioned deposition methods) and passivation materials selected according to the composition of the fins 202 and gate electrode 260 are also possible, as will be appreciated.

Figure 2G:
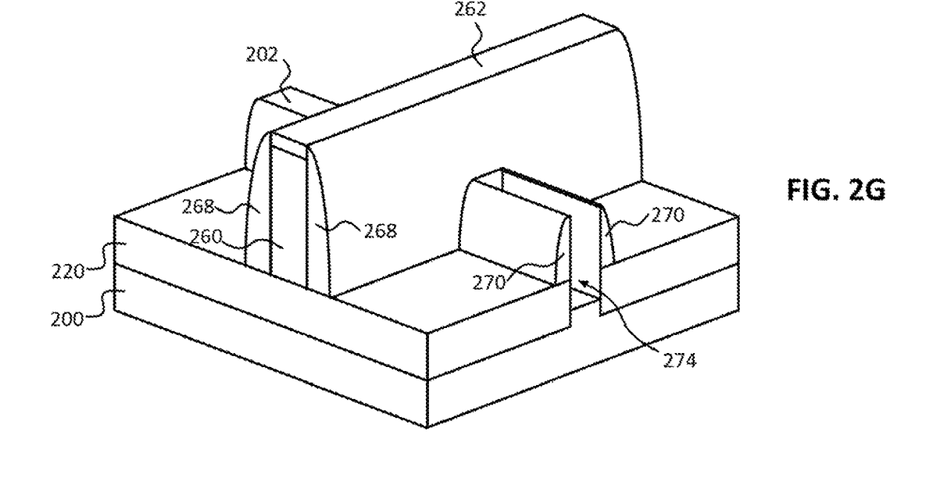
Figure 2H:
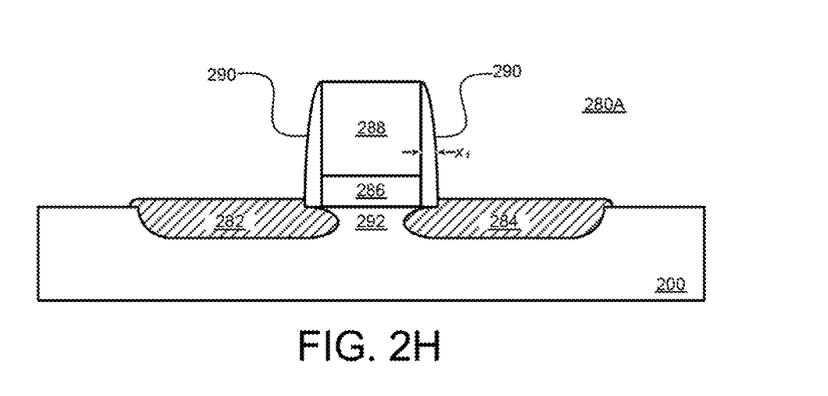
FIGS. 2H-2H' illustrate example structures formed when carrying out the method of FIG. 1B, in accordance with various embodiments of the present disclosure.
Figure 2I:
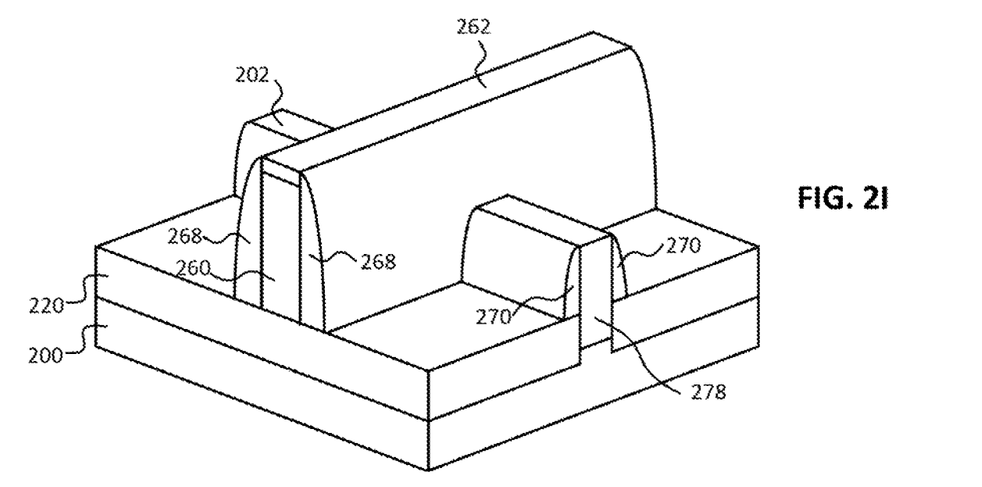
FIGS. 2I, 2J illustrate example structures formed when carrying out the method of FIG. 1C, in accordance with various embodiments of the present disclosure.
Figure 2J:
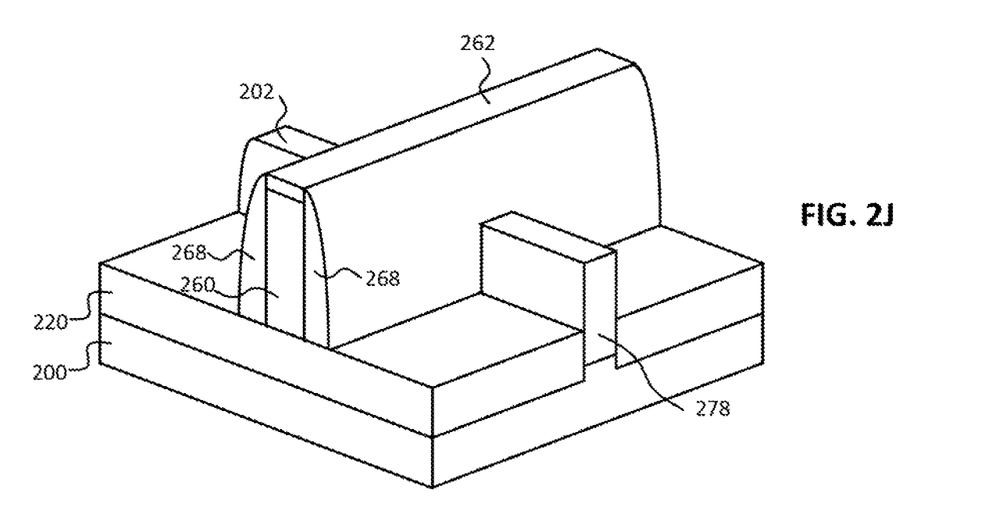

Continuing with the method 100, portions of the fins 202 are formed 112 (e.g., by etching) to form trenches corresponding to one or both of the source/drain portions of the fin 202, as is shown in FIG. 2G. The forming 112 can be performed, for example, with a directional etch that is selective to the fin material while not etching the exposed spacers 268 and 270 or mask 264 or STI material 220. To the end, the chemical composition of the directional etch can be selected for its reactivity with, and ability to remove, the material of the fin 202. Furthermore, the method of etching can be selected to primarily attack surfaces that are substantially perpendicular to the direction from which the etchant is provided. Selecting a directional etch reactive with the fin 202 material and not the spacers 268, 270 (e.g., reactive with silicon but not silicon nitride) removes the fin 202 material while leaving the spacers substantially unaffected. Examples of directional etches include reactive ion etching (RIE), plasma etching, chemical dry etching, and others. In another example, a wet chemical etch can be used in combination with protective masking techniques to expose only the material of the fin 242 for removal by the etchant. While the trenches are substantially free of the fin 202 material, in some examples a thin (e.g., approximately 1 to 5 nm) layer of the fin 202 material (e.g., silicon) remains at a bottom of the trench proximate to the substrate 200, so as so provide a pedestal upon which the source/drain material is deposited. In some embodiments, this thin layer of fin 202 material can act as a seed layer for selective deposition of an amorphous alloy of silicon, germanium, and carbon, as described below in more detail. In other embodiments, portions of the fin 202 can be completely removed, such that the recess bottom is flush with the surface of the substrate 200 that interfaces with the STI 220. In still other embodiments, portions of the fin 202 can be recessed further into the substrate 200, past the surface of the substrate 200 that interfaces with the STI 220. In any such cases, the trench bottom can have any morphology, but is flat or faceted in accordance with some embodiments.

As will be described below in more detail in the context of FIG. 1C and the sub-methods 114 of FIG. 1A (for non-planar configurations) and 124 of FIG. 1B (for planar configurations), an amorphous alloy of $Si_xGe_{1-x-y}C_y$ is deposited 114, 124 in these trenches and crystallized to apply tensile strain to the channel region of the fin 202 remaining under the gate stack. Figures illustrating corresponding structures to both planar and non-planar transistor configurations will also be discussed below with concurrent reference to FIG. 1C.

After the replacement material is deposited 114 in the trenches (as described below), the formation of the transistors can be completed, at 116. In one example of completing 116 formation of the transistors, the dummy gate electrode 260, dummy gate dielectric 262, and gate mask 264 are removed and replaced with final gate dielectric and gate electrode materials. As previously noted, this process is often referred to as the "replacement metal gate" or RMG process. In addition, or alternatively, completion 116 of the transistors may further include forming electrical contacts on the source/drain regions of the fins 202. This may be achieved, for instance, by first depositing and planarizing additional insulator material, so as to provide a surface suitable for any further processing. Then, contact trenches can then be etched through that additional insulator material, over the source/drain regions. The trenches can then be filled with contact materials using any of a variety of deposition methods. Example source drain contact materials include, for example, tungsten, titanium, silver, gold, aluminum, copper, cobalt, and alloys thereof. The contacts may include multiple layers, such as work function tuning layers, resistance-reducing layers, and capping layers.

FIG. 1B illustrates a method 118 of forming a planar integrated circuit in which a tensile strain is applied to a channel region of the planar integrated circuit, in accordance with various embodiments of the present disclosure. Example structures of the method 118 are shown in FIGS. 2H and 2H'. FIGS. 2H and 2H' illustrate examples of planar architectures 280A and 280B, respectively, to which some embodiments of the present disclosure may be applied. Each of these embodiments include source and drain regions 282 and 284, a gate dielectric layer 286, a gate electrode 288, spacers 290, and a channel region 292, all of which are disposed on a substrate 200.

The method 118 begins by forming 120 gate stacks on a substrate 200. The gate stacks in both of the embodiments 280A and 280B shown in FIGS. 2H and 2H', respectively, include a gate dielectric layer 286 and a gate electrode 288. The gate stack (gate dielectric layer 286 and gate electrode 288, collectively) is confronted on opposite sides by spacers 290. In some example cases, the spacers 290 create a distance of about 10 to 20 nanometers (nm) between the edges of the gate dielectric layer 286 and the edges of each of the source and drain regions 282 and 284, respectively, which are described below in more detail. In one example, the gate dielectric layer 286 may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric layer 286 may be thermally grown on the substrate. The gate dielectric material 286 may be formed, for example, from materials such as silicon dioxide or high-k dielectric materials (such as those previously mentioned with respect to gate dielectric 262). In some specific example embodiments, the high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts.

The material forming the gate electrode 288 may be deposited on the gate dielectric layer using similar deposition techniques (e.g., ALD, CVD, PVD) to those used to deposit the gate dielectric layer 286. In some such specific embodiments, the gate electrode material is polysilicon or a metal layer, although other suitable gate electrode materials can be used as well. The gate electrode material, which may be a sacrificial material that is later removed for a replacement metal gate (RMG) process, has a thickness in the range of 50 Å to 500 Å (e.g., 100 Å), in some example embodiments.

Spacers 290 are formed using deposition techniques analogous those described above in the context of non-planar transistor architectures. The spacers 290 may be deposited having any of a variety of widths, shown in FIGS. 2H and 2H' as $x_1$ and $x_2$. The differing widths of the spacers may be one factor used to determine the relative sizes and relative locations of source and drain regions 282 and 284. Similar spacer width considerations apply equally to non-planar embodiments.

With further reference to FIG. 1B, trenches corresponding to source and drain regions 282 and 284 are formed 122

(e.g., by etching) into the substrate using any of the etching techniques described above. In the example shown in FIG. 2H, the etched trenches extend different distances into the channel region 292 relative to the gate stack. For example, in the embodiment 280A of FIG. 2H, the trenches 282 and 284 extend completely under the spacers 290 and partially under the gate dielectric 286 whereas in the embodiment 280B of FIG. 2H', the trenches corresponding to source and drain regions 282 and 284 extend only part way under spacers 290 and do not extend under the gate dielectric 286.

Continuing with method 118 and reference to FIG. 1B, regardless of the dimensions of the trenches, a replacement material is deposited 124 into the trenches to form the source and drain regions 282 and 284. The replacement material in this case is an amorphous $Si_xGe_{1-x-y}C_y$ alloy that is described below in more detail in the context of FIG. 1C.

Alternative embodiments of transistors, such as those that use nanowire configurations, are described below in the context of FIGS. 3A and 3B.

Applying Tensile Strain to a Channel Region

Regardless of how the transistors are fabricated or the planar or non-planar configuration of the transistors, FIG. 1C presents further details of sub-methods 114, 124 of methods 100 and 118, respectively. FIG. 1C illustrates an example process for applying a tensile strain to a p-doped channel region of an NMOS transistor. At a high level, the structures and methods described below fabricate S/D regions of a transistor by replacing the originally deposited S/D or substrate material (whether for a planar or non-planar architecture) with an amorphous alloy of $Si_xGe_{1-x-y}C_y$. Upon crystallizing the amorphous alloy of $Si_xGe_{1-x-y}C_y$, the S/D regions of an NMOS transistor apply a strain to the corresponding p-doped channel region between the S/D regions. As indicated above, application of a tensile strain as described herein improves n-type dopant activation in NMOS transistors and reduces n-type dopant diffusion from source and drain regions into a p-doped channel region. The S/D portions may be n-doped doped to form NMOS transistors during or after deposition of the amorphous alloy of $Si_xGe_{1-x-y}C_y$.

The sub-method 114 presented for embodiments in which the S/D regions are non-planar is described first. The sub-method 124 presented for embodiments in which the S/D regions are planar is described after the description of sub-method 114.

The method 114 begins by depositing 142 an amorphous alloy of $Si_xGe_{1-x-y}C_y$ in the trenches formerly occupied by the portions of fins 202 beyond the boundaries of the gate stack, as shown in FIGS. 2I, and 2J. In the embodiment shown in FIG. 2I, the deposited 142 $Si_xGe_{1-x-y}C_y$ alloy 278 occupies the entire trench. As mentioned above, the $Si_xGe_{1-x-y}C_y$ alloy 278 is deposited 142 with at least 5 atomic % of carbon in some example embodiments. In some example cases, the $Si_xGe_{1-x-y}C_y$ alloy 278 is deposited 142 with at least 10 atomic % or with at least 15 atomic % of carbon. The $Si_xGe_{1-x-y}C_y$ alloy 278 deposition 142 can be performed using any of the deposition techniques described above including, but not limited to, CVD, ALD, PVD, and others. The example shown in FIG. 2J is the embodiment shown in FIG. 2I in which the spacers 270 have been removed, according to an embodiment.

In one example, regardless of the carbon content, the $Si_xGe_{1-x-y}C_y$ alloy 278 selectively deposits on silicon, thus facilitating deposition of the $Si_xGe_{1-x-y}C_y$ alloy 278 mostly within trenches in which a thin seed layer of silicon is exposed at a bottom of the trench. In some examples, the seed layer of silicon is present after a partial removal of a silicon fin. In other examples, the seed layer of silicon is present by exposing an underlying silicon substrate. This selective deposition facilitates fabrication of structures of the present disclosure because a mask (whether a hardmask or a photolithographic mask) is not required to prevent $Si_xGe_{1-x-y}C_y$ alloy 278 from depositing on anything other than the exposed silicon seed layer. This is turn improves processing cycle time, lowers processing costs, and improves yields of functioning transistors. Note, however, that such selectivity is not perfect, and some minimal or otherwise negligible amount of $Si_xGe_{1-x-y}C_y$ alloy may deposit in non-S/D areas. A cleaning cycle may be used to remove any such extraneous deposition material.

Continuing with the example embodiment of FIG. 1C, the $Si_xGe_{1-x-y}C_y$ alloy 278 is doped 144 to produce n-type source drain regions, which effectively defines the type of transistor device (n-type S/D regions provide an NMOS transistor). In some embodiments, a dopant may be incorporated in-situ during S/D growth, or implanted or deposited into the amorphous $Si_xGe1_{-x}C$ alloy 278 after deposition 142 of the $Si_xGe_{1-x-y}C_y$ alloy 278. In yet another embodiment, a dopant may be implanted or otherwise deposited into the $Si_xGe1_{-x}C$ alloy 278 after crystallization. Regardless of when the source/drain regions are doped 144, note that the channel region may be p-type doped, or remain undoped. In some embodiments, the resulting NMOS transistors may be combined with PMOS transistors on a common substrate or die to form CMOS devices. Doping, as variously described herein, may be performed using any suitable techniques and dopants, depending, for example, upon the material being doped, the desired n-type or p-type doping result, and/or the target application. In various embodiments, n-type source/drain dopants include phosphorous, arsenic and antimony. Other dopants can be selected for different configurations of transistors. Channel dopants may include, for instance, boron, aluminum, gallium or other p-type dopants. Channel materials include Si, SiGe alloys and Ge.

With further reference to method 118 of FIG. 1B, to apply a tensile strain to the channel region corresponding to interfaces with the gate stack, the amorphous alloy of $Si_xGe_{1-x-y}C_y$ 278 is crystallized 148. Crystallization 148 of the amorphously deposited alloy of $Si_xGe_{1-x-y}C_y$ 278 can be accomplished in any of a number of methods. In one example, the $Si_xGe_{1-x-y}C_y$ alloy 278 is heated to a temperature enabling crystallization 148 using rapid thermal annealing. In another example, the $Si_xGe_{1-x-y}C_y$ 278 alloy is heated to a temperature enabling crystallization 148 using laser melt recrystallization. Other annealing techniques for thermally processing the $Si_xGe_{1-x-y}C_y$ alloy 278 may also be used. Regardless, one benefit of some embodiments of the present disclosure is that, because the $Si_xGe_{1-x-y}C_y$ alloy 278 is deposited and crystallized much of the front end substrate processing has been completed (e.g., after the gate stack has been deposited), the thermal processing performed on the $Si_xGe_{1-x-y}C_y$ alloy 278 can be performed without disturbing previously deposited features of a corresponding integrated circuit. In other words, features of a device that may be sensitive to thermal fluctuations are protected from heating of the $Si_xGe_{1-x-y}C_y$ alloy 278 by, for example, the gate stack and various other layers already fabricated on a substrate. Furthermore, the thermal processing for crystallization can, in some examples, be performed at lower temperatures or over shorter time scales than processes in which a material is deposited in crystalline form.

Upon crystallization 148 in this embodiment, a volume previously occupied by the $Si_xGe_{1-x-y}C_y$ alloy 278 is reduced because the amorphous phase of the $Si_xGe_{1-x-y}C_y$ alloy 278 has a per unit volume larger than that of its crystalline analog. There are at least two reasons for this. First, upon recrystallization carbon atoms occupy lattice sites that, in a pure SiGe alloy, would be occupied by either one or the other of silicon or germanium, both of which have a larger atomic radius than carbon. Thus, upon recrystallization and the substitution of carbon for some of the silicon or germanium atoms within each unit cell of the crystal, the dimensions of each unit cell shrink in response to the substitution of carbon for one of the larger atoms. Furthermore, because of its disordered state, an amorphous material is often less dense (i.e., less mass per unit volume) than a crystalline analog. However, in other embodiments it will be appreciated that a configuration can be arranged to apply a compressive tensile strain on the gate region For at least these reasons, the volume of the $Si_xGe_{1-x-y}C_y$ alloy 278 decreases upon recrystallization. Because the $Si_xGe_{1-x-y}C_y$ alloy 278 is joined to the gate stack, upon recrystallization and the resulting reduction in volume, the crystallized $Si_xGe_{1-x-y}C_y$ alloy 278, disposed between the spacer layers 270, exerts a tensile strain on the channel region proximate to the S/D regions and the gate stack 260. This tensile strain has a benefit, as indicated above. In one example, a tensile strain as applied according to the present disclosure to the channel region regions improves electron mobility in the channel region. While in the amorphous state, the Si based alloy has an active dopant concentration approximately in the range of $1\times10^{18}$ atoms/cm$^3$. In some examples, active dopant concentrations can exceed $1\times10^{21}$ dopant atoms/cm$^3$ when S/D regions have been converted to a crystalline structure according to the present disclosure. In another example, high carbon concentrations reduce diffusion of dopant atoms into a channel region between S/D regions during the thermal processing of recrystallization because carbon is efficient at capturing point defects that facilitate diffusion.

Turning now to the planar-transistor version of method 118 of FIG. 1C for fabrication of planar integrated circuits (examples of which are shown in FIGS. 2H and 2H'), the amorphous $Si_xGe_{1-x-y}C_y$ alloy 278 is deposited 142 as a replacement material in the trenches previously etched 122 to form source and drain regions. As described above in the context of sub-method 124, in some examples a seed layer of silicon may be present within the trenches or an underlying silicon substrate (e.g., substrate 200) may be used as a preferential deposition site of the amorphous $Si_xGe_{1-x-y}C_y$ alloy. Similar to the sub-method 124, the deposited amorphous $Si_xGe_{1-x-y}C_y$ alloy 278 is doped 144 to form one of a source region and a drain region 282, 284 in each of the etched 122 trenches using dopants and processes described above. The amorphous $Si_xGe_{1-x-y}C_y$ alloy 278 is then crystallized 148, as also described above, to apply a strain on the channel region 292 of the planar transistors 280A and 280B.

FIGS. 2H and 2H' are presented to illustrate that the trenches, and resulting source and drain regions 282 and 284 may extend to different degrees into the channel region relative to the spacers 290. In the example 280A of FIG. 2H, because the source and drain regions 282 and 284 extend deeper into the channel region 292, a strain imposed on the channel region 292 may be greater than that of the example 280B in FIG. 2H'. For this latter example, any strain applied to the channel region 292 by crystallization of the $Si_xGe_{1-x-y}C_y$ alloy in the source and drain regions 282 and 284 may be reduced by lack of proximity to the channel region 292.

Nanowire Embodiments

The techniques described above can be applied to nanowire transistor embodiments, as shown in FIGS. 3A and 3B. A nanowire transistor (sometimes referred to as a gate-all-around or nanoribbon transistor) is configured similarly to a fin-based transistor, but instead of a finned channel region where the gate is on two or three sides of the fin (and thus, providing two or three effective gates, respectively), one or more nanowires are used and the gate material generally surrounds each nanowire on all sides. Depending on the particular design, some nanowire transistors have, for example, four effective gates. As can be seen in the example structure of FIG. 3A, the channel regions each have two nanowires 346, although other embodiments can have any number of nanowires. The nanowires 346 may have been formed while the channel region was exposed during a replacement gate process (e.g., an RMG process), after the dummy gate is removed, for example. Wire formation occurs when a multilayer fin is exposed to an etchant and one material type is preferentially removed while leaving the other intact. Note that any combination of transistor configurations may be used for a single integrated circuit, including planar, dual gate, finned (or tri-gate or FinFET), nanowire (or nanoribbon or gate-all-around), and/or any other suitable transistor configuration, depending on the end use or target application.

In the example shown, the nanowires 346 are adjacent to source/drain portion of the fins formed from the $Si_xGe_{1-x-y}C_y$ alloy 278 so that, upon applying some of the embodiments described above, a strain is applied to the nanowires 346.

In the example shown in FIG. 3B, the nanowires 346 of the channel are adjacent to a multilayer fin structure in the source/drain regions that includes two layers of the $Si_xGe_{1-x-y}C_y$ alloy 278 alternating with layers of another material 348. In one embodiment, the material 348 is an inactive or dielectric material that effectively isolates the individual layers of the $Si_xGe_{1-x-y}C_y$ alloy 278 in one of the source or the drain from each other. As in the example of FIG. 3A, the $Si_xGe_{1-x-y}C_y$ alloy 278 applies a strain to the nanowires 346. Note that only one of a source or a drain in the FIG. 3B includes nanowires, but in other embodiments, both of a source and a corresponding drain may include a similar nanowire configuration.

Example System

Figure 4:
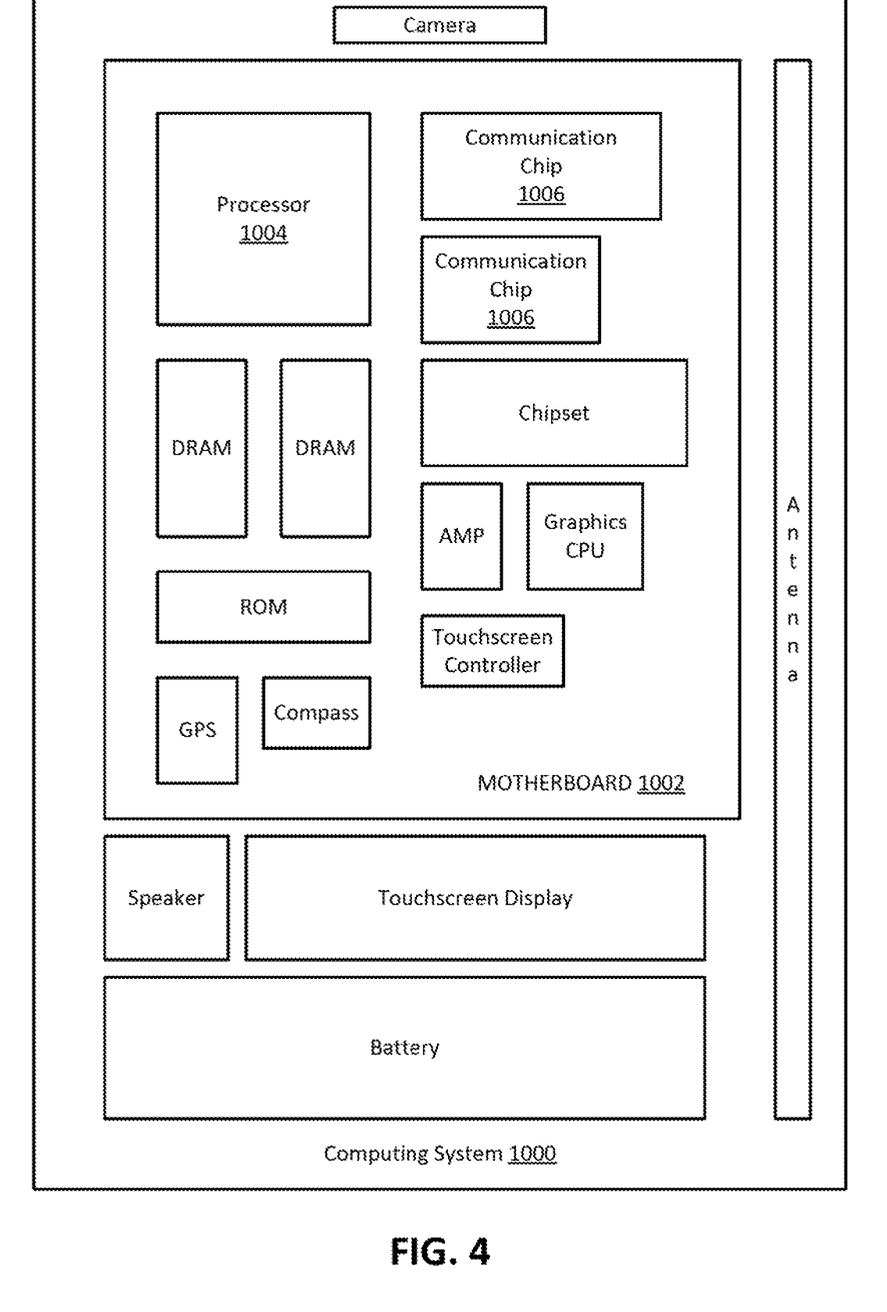
FIG. 4 illustrates a computing system implemented with integrated circuit structures or devices formed using the techniques disclosed herein, in accordance with an embodiment of the present disclosure.

FIG. 4 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including a semiconductor substrate, a source region and a drain region disposed at least one of on and in the substrate, the source region and the drain region each comprising an alloy of silicon, germanium, and carbon, and a channel region disposed between the source region and the drain region.

Example 2 includes the subject matter of Example 1, wherein the alloy is $Si_xGe_{1-x-y}C_y$.

Example 3 includes the subject matter of any of Examples 1-2, wherein a carbon content of the alloy is at least 5 atomic percent.

Example 4 includes the subject matter of any of Examples 1-3, wherein a carbon content of the alloy is at least 10 atomic percent.

Example 5 includes the subject matter of any of Examples 1-4, wherein the alloy includes a dopant.

Example 6 includes the subject matter of any of Example 5, wherein the dopant is at least one of phosphorous, arsenic and antimony.

Example 7 includes the subject matter of any of Examples 1-6, wherein the channel region comprises at least one of silicon, silicon germanium, or germanium.

Example 8 includes the subject matter of any of Examples 1-7, wherein the alloy is crystalline.

Example 9 includes the subject matter of any of Examples 1-8, wherein the crystalline alloy applies a tensile strain to the channel region of the integrated circuit.

Example 10 includes the subject matter of any of Examples 1-9, wherein the substrate is silicon.

Example 11 includes the subject matter of any of Examples 1-10, wherein the crystalline alloy includes carbon-rich precipitates.

Example 12 includes the subject matter of any of Examples 1-11, and further includes spacers adjacent to at least one of the source region and the drain region, wherein the spacers are fabricated from dielectric material.

Example 13 includes the subject matter of any of Examples 1-12, wherein each spacer is from 1 nm to 10 nm thick and is implemented with silicon nitride.

Example 14 includes the subject matter of any of Examples 12-13, wherein each spacer contains up to 10 atomic percent of at least one of carbon, silicon, and oxygen.

Example 15 includes the subject matter of any of Examples 1-14, wherein the source region, the drain region, and the channel region are configured in a non-planar transistor.

Example 16 includes the subject matter of Example 15, wherein at least one of the source region, the drain region, and the channel region comprise a fin structure.

Example 17 includes the subject matter of any of Examples 1-16, wherein the source region, the drain region, and the channel region are configured in a planar transistor.

Example 18 is a computing system comprising the integrated circuit of any of claims 1-17.

Example 19 is an integrated circuit including a substrate, and a semiconductor fin extending from the substrate, the fin comprising a source region, a drain region, and a channel region disposed between the source region and the drain region, each of the source region and the drain region comprising an alloy of silicon, germanium, and carbon.

Example 20 includes the subject matter of Example 19, wherein the alloy is $Si_xGe_{1-x-y}C_y$. Example 21 includes the subject matter of any of Examples 19-20, wherein a carbon content of the alloy is at least 5 atomic percent.

Example 22 includes the subject matter of any of Examples 19-21, wherein a carbon content of the alloy is at least is at least 10 atomic percent.

Example 23 includes the subject matter of any of Examples 19-22, wherein the alloy is crystalline and applies a tensile strain to a channel region of the integrated circuit.

Example 24 includes the subject matter of any of Examples 19-23, wherein the alloy includes carbon-rich precipitates.

Example 25 includes the subject matter of any of Examples 19-24, wherein the fin is configured with one or more nanowires in at least one of the channel region, the source region, and the drain region.

Example 26 is a computing system including the integrated circuit of any of claims 19-25.

Example 27 is a method of forming an integrated circuit, the method including forming a source trench into a first structure of a substrate, the source trench corresponding to a source region, forming a drain trench into a second structure of the substrate, the drain trench corresponding a drain region, forming a channel region between the source region and the drain region, depositing in both of the source trench and the drain trench an amorphous alloy of silicon, germanium, and carbon, and crystallizing the amorphous alloy of silicon, germanium, and carbon, the crystallizing applying a tensile strain to the channel region.

Example 28 includes the subject matter of Example 27, wherein the amorphous alloy is $Si_xGe_{1-x-y}C_y$.

Example 29 includes the subject matter of any of Examples 27-28, wherein a carbon content of the amorphous alloy is at least 5 atomic percent.

Example 30 includes the subject matter of any of Examples 27-29, wherein a carbon content of the amorphous alloy is at least 10 atomic percent.

Example 31 includes the subject matter of any of Examples 27-30, and further includes providing the amorphous alloy with a dopant.

Example 32 includes the subject matter of any of Examples 27-31, wherein the amorphous alloy is doped either in-situ or after depositing the amorphous alloy in the source trench and the drain trench.

Example 33 includes the subject matter of any of Examples 27-32, and further includes providing the crystalline alloy with a dopant.

Example 34 includes the subject matter of any of Examples 27-33, wherein the first and second structures on the substrate are planar regions on the substrate adjacent to the channel region.

Example 35 includes the subject matter of any of Examples 27-34, wherein the first second structures on the substrate comprise portions of a fin extending from the substrate.

Example 36 includes the subject matter of any of Examples 27-35, wherein depositing the amorphous alloy of silicon, germanium, and carbon is part of a multilayer stack formation process that further includes depositing one or more additional layers to complete the multilayer stack.

Example 37 includes the subject matter of any of Examples 27-35, and further includes depositing spacers on exposed faces of the fin, wherein etching the source and drain trenches includes etching fin material between the spacers.

What is claimed is:

1. An integrated circuit comprising:
    a source region and a drain region, each comprising an alloy of silicon, germanium, and at least 5 atomic percent carbon; and
    a semiconductor region distinct from and between the source region and the drain region.

2. The integrated circuit of claim 1, wherein the alloy is $Si_xGe_{1-x-y}C_y$.

3. The integrated circuit of claim 1, wherein a carbon content of the alloy is at least 10 atomic percent.

4. The integrated circuit of claim 1, wherein the alloy includes a dopant.

5. The integrated circuit of claim 4, wherein the dopant is at least one of phosphorous, arsenic and antimony.

6. The integrated circuit of claim 1, wherein the semiconductor region comprises at least one of silicon, silicon germanium, and germanium.

7. The integrated circuit of claim 1, wherein the alloy is crystalline and applies a tensile strain to the semiconductor region of the integrated circuit.

8. The integrated circuit of claim 7, wherein the crystalline alloy includes carbon-rich precipitates.

9. The integrated circuit of claim 1, wherein the source region, drain region, and semiconductor region are configured in a non-planar transistor.

10. The integrated circuit of claim 1, wherein the source region, drain region, and semiconductor region are configured in a planar transistor.

11. An integrated circuit comprising:
    a semiconductor body, the semiconductor body comprising one of a fin, nanowire, or nanoribbon;
    a gate structure at least above and adjacent sides of at least a portion of the semiconductor body, the gate structure including a gate electrode and a gate dielectric between the gate electrode and the at least a portion of the semiconductor body; and
    a source region and a drain region, the at least a portion of the semiconductor body being between the source region and the drain region, each of the source region and the drain region comprising an alloy of silicon, germanium, and carbon, wherein the carbon concentration is at least 5 atomic percent.

12. The integrated circuit of claim 11, wherein the alloy is $Si_xGe_{1-x-y}C_y$.

13. The integrated circuit of claim 11, wherein a carbon content of the alloy is at least is at least 10 atomic percent.

14. The integrated circuit of claim 11, wherein the alloy is crystalline and applies a tensile strain to a channel region of the integrated circuit.

15. The integrated circuit of claim 11, wherein the alloy includes carbon-rich precipitates.

16. A method of forming an integrated circuit, the method comprising:
    forming a semiconductor body, the semiconductor body comprising one of a fin, nanowire, or nanoribbon;
    forming a gate structure at least above and adjacent sides of at least a portion of the semiconductor body, the gate structure including a gate electrode and a gate dielectric between the gate electrode and the at least a portion of the semiconductor body;
    forming a source trench to one side of the gate structure, the source trench corresponding to a source region;

forming a drain trench to another side of the gate structure, the drain trench corresponding a drain region;

depositing in both of the source trench and the drain trench an amorphous alloy of silicon, germanium, and carbon, wherein the carbon concentration is at least 5 atomic percent; and crystallizing the amorphous alloy of silicon, germanium, and carbon, the crystallizing applying a tensile strain to the at least a portion of the semiconductor body.

17. The method of claim 16, wherein the amorphous alloy is $Si_xGe_{1-x-y}C_y$.

18. The method of claim 16, wherein a carbon content of the amorphous alloy is at least 10 atomic percent.

* * * * *